(12) United States Patent
Conraux

(10) Patent No.: US 9,978,434 B2
(45) Date of Patent: May 22, 2018

(54) METHOD FOR WRITING IN A MAGNETIC DEVICE HAVING A PLURALITY OF MAGNETIC LOGICAL UNIT CELLS USING A SINGLE PROGRAMMING CURRENT

(71) Applicant: CROCUS Technology SA, Grenoble (FR)

(72) Inventor: Yann Conraux, Sassenage (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days. days.

(21) Appl. No.: 15/516,085

(22) PCT Filed: Oct. 2, 2015

(86) PCT No.: PCT/EP2015/072881
§ 371 (c)(1),
(2) Date: Mar. 31, 2017

(87) PCT Pub. No.: WO2016/050982
PCT Pub. Date: Apr. 7, 2016

(65) Prior Publication Data
US 2017/0249982 A1    Aug. 31, 2017

(30) Foreign Application Priority Data
Oct. 3, 2014   (EP) .................................... 14290300

(51) Int. Cl.
*G11C 11/16* (2006.01)

(52) U.S. Cl.
CPC ...... *G11C 11/1675* (2013.01); *G11C 11/1693* (2013.01)

(58) Field of Classification Search
CPC . G11C 11/1675; G11C 11/1693; G11C 11/16; G11C 11/15; H01L 43/08
(Continued)

(56) References Cited

U.S. PATENT DOCUMENTS

| 7,994,597 B2* | 8/2011 | Min | H01L 43/08 257/421 |
| 9,305,628 B2* | 4/2016 | Stainer | H01F 10/3254 |

(Continued)

FOREIGN PATENT DOCUMENTS

| EP | 2688103 A1 | 1/2014 |
| EP | 2712079 | 3/2014 |

(Continued)

OTHER PUBLICATIONS

International Search Report for PCT/EP2015/072881 dated Dec. 18, 2015.

(Continued)

*Primary Examiner* — David Lam
(74) *Attorney, Agent, or Firm* — Pearne & Gordon LLP

(57) ABSTRACT

Method for programming a magnetic device including a plurality of magnetic logical unit MLU cells using a single programming current, each MLU cell includes a storage magnetic layer having a storage magnetization that is pinned at a low threshold temperature and freely orientable at a high threshold temperature. A programming line is physically separated from each of the plurality of MLU cells and configured for passing a programming current pulse for programming any one of the plurality of MLU cells. The method includes: passing the programming current in the field line for heating the magnetic tunnel junction of each of the plurality of MLU cells at the high threshold temperature such as to unpin the second magnetization; wherein the programming current is further adapted for generating a programming magnetic field adapted for switching the storage magnetization of each of the plurality of MLU cells in a programmed direction.

15 Claims, 7 Drawing Sheets

(58) Field of Classification Search
USPC .................... 365/145, 158, 171, 173, 50, 55
See application file for complete search history.

(56) References Cited

U.S. PATENT DOCUMENTS

| | | |
|---|---|---|
| 2004/0136235 A1 | 7/2004 | Ohmori |
| 2013/0241536 A1 | 9/2013 | Cambou et al. |
| 2016/0238676 A1* | 8/2016 | Bandiera .............. G01R 33/098 |

FOREIGN PATENT DOCUMENTS

| | | |
|---|---|---|
| EP | 2744002 | 6/2014 |
| WO | 2014051724 A1 | 4/2014 |

OTHER PUBLICATIONS

Written Opinion for PCT/EP2015/072881 dated Dec. 18, 2015.
Prejbeanu I L et al.: "Paper; Thermally assisted MRAMs: ultimated scalability and logic functionalities; Thermally assisted MRAMs: ultimate scalability and logic functionalities", Journal of Physics Publishing Ltd, Jan. 31, 2013, pp. 1-16, vol. 46, No. 7, GB.

* cited by examiner

METHOD FOR WRITING IN A MAGNETIC DEVICE HAVING A PLURALITY OF MAGNETIC LOGICAL UNIT CELLS USING A SINGLE PROGRAMMING CURRENT

FIELD

The present invention concerns a method for programming a magnetic device comprising a plurality of Magnetic Logical Unit (MLU) cells.

BACKGROUND

A conventional MLU cell comprises a magnetic tunnel junction comprising a ferromagnetic reference layer and a ferromagnetic storage layer. When the magnetizations of the two layers are aligned the resistance of the stack is low, this could be a "0" (or arbitrarily a "1"). When the layers are anti-aligned the resistance is high, this could be a "1" (or vice versa).

In thermally-assisted-switching (TAS) MLU's the storage layer is blocked by an antiferromagnetic layer such as to achieve superior stability in normal operating temperatures. During a programming cycle, the temperature of the cell is momentarily locally raised above a blocking temperature of the antiferromagnetic layer (high threshold temperature), through resistive heating of the magnetic tunnel junction, allowing the magnetoresistance of the TAS-MLU cell to be varied. At normal operating temperatures the information (i.e., magnetic orientation) stored in TAS-MLU cells is thus not affected by external fields and noise.

Self-referenced MLU cells can be based on TAS MLU cells. Self-referenced MLU cells typically have the reference layer that is not pinned by an antiferromagnetic layer but is free to be varied. Such unpinned reference layer is often called "sense layer". When a current is applied in a field line adjacent to the MLU cell, a magnetic field is generated such as to vary the sense layer magnetization during a read operation. A two-phase read operation utilizes the natural tendency of an un-driven field line's effect on a selected memory cell to create a momentary reference value that is compared to the cell's value when the field is driven. The stored information is thus read as this field is applied.

During logic operations the field lines are acting as controlling gates modulating the resistivity of the magnetic tunnel junction. The MLU cell behaves as a three-terminal device capable of performing native logical functions. The currents circulating in the field line can be modulated in direction, and intensity.

An MLU amplifier can be provided by electrically coupling an array comprising several (possibly tens of thousands) of MLU cells together. The gain of the resulting amplifier is largely increased device while the coupling capacitance remains very small. For each MLU cell, the magnetoresistance of the magnetic tunnel junction is modulated by the direction of a field current flowing through a field line which is set by an input bit to be matched. A high or low magnetoresistance at the output indicates whether the input bit matches the stored bit or not, respectively.

Operating MLU amplifier thus requires applying a heating current for heating the magnetic tunnel junction of each of the MLU cells and a field current for generating the magnetic field. The heating current and the field current must be accurately synchronized.

Moreover, in a MLU array comprising a plurality of MLU cells, the heating current passes through the magnetic tunnel junction of the MLU cells connected in series in a row or column. Depending on the number of MLU cells comprises in the MLU array, the magnitude of the heating current required for heating the magnetic tunnel junctions in the array can reach several hundreds of mA. The corresponding voltage can thus reach several tens of Volts resulting in very high voltage difference (equivalent to several hundreds of MV/m) in some area of the MLU cells, such as in the magnetic tunnel junction and in particular in the tunnel barrier layer or any dielectric layer between two metal levels. Such high voltage difference can irreversibly weaken and even destroy the MLU cell.

SUMMARY

The present disclosure concerns a method for programming a magnetic device comprising a plurality of MLU cells; each MLU cell comprising a storage magnetic layer having a storage magnetization that is pinned at a low threshold temperature and freely orientable at a high threshold temperature; a programming line physically separated from each of said plurality of MLU cells and configured for passing a programming current pulse for programming any one of said plurality of MLU cells; the method comprising:

passing the programming current in the field line for heating the magnetic tunnel junction of each of said plurality of MLU cells at the high threshold temperature such as to unpin the second magnetization;

wherein the programming current is further adapted for generating a programming magnetic field adapted for switching the storage magnetization of each of said plurality of MLU cells in a programmed direction.

More particularly, the present disclosure concerns a method for programming a magnetic device comprising a plurality of MLU cells using a single programming current; each including a magnetic tunnel junction comprising a ferromagnetic storage layer having a storage magnetization that is pinned at a low threshold temperature and freely orientable at a high threshold temperature, a ferromagnetic sense layer having a sense magnetization, and a tunnel barrier layer between the storage layer and the sense layer; a programming line physically separated from each of said plurality of MLU cells by an electrically non-conductive layer such that no current can pass directly from the programming line to the magnetic tunnel junction, and configured for passing a programming current pulse for programming a subset of said plurality of MLU cells, the subset comprising more than one MLU cell; the method comprising:

passing the programming current in the programming line for heating the magnetic tunnel junction of said MLU cells in the subset at the high threshold temperature such as to unpin the ferromagnetic storage magnetization of each of the MLU cells in the subset;

wherein the programming current is further adapted for generating a programming magnetic field adapted for switching the storage magnetization of each MLU cell in the subset in a programmed direction.

In the method disclosed herein, a single programming current is used for both heating the magnetic tunnel junction and inducing the programming magnetic field and thus programming the subset of MLU cells. The method does not require any additional current nor synchronizing between two currents. Moreover, since no heating current is passed through the magnetic tunnel junction, the risk of weakening or destroying the MLU cell is strongly reduced and the MLU cell and an MLU array comprising a plurality of MLU cells is more robust.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 4:
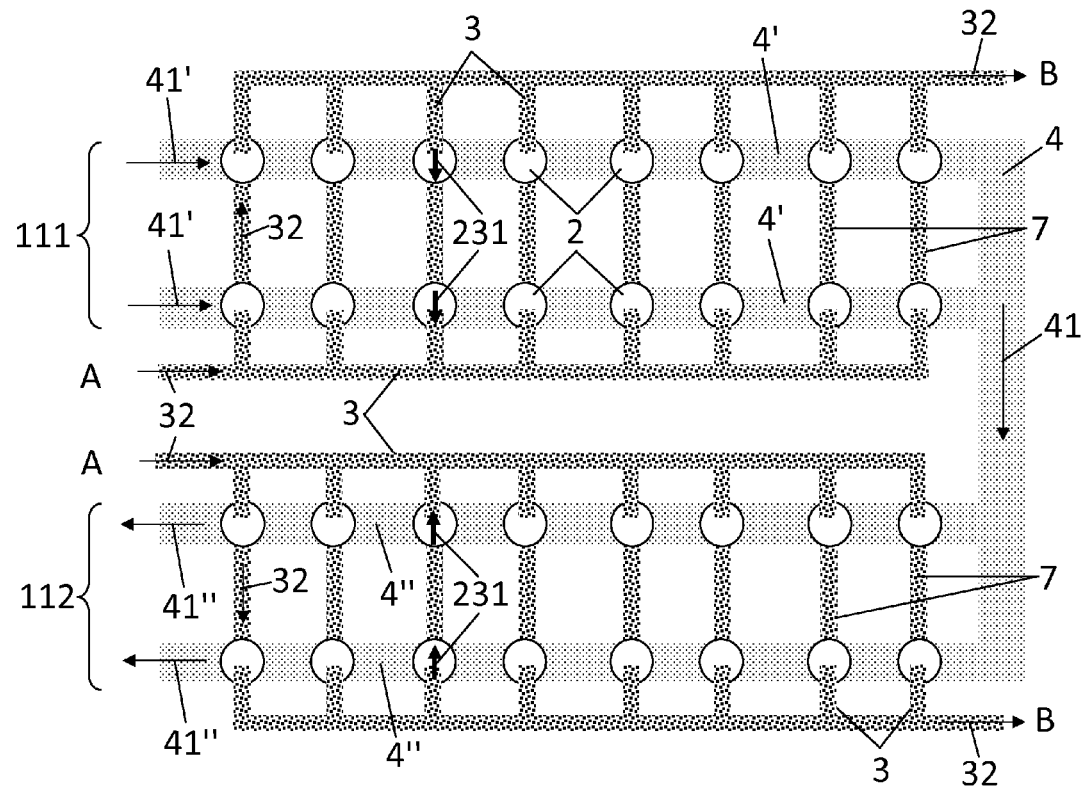
FIG. 4 illustrates a top view of a magnetic device comprising a plurality of the MLU cells, according to an embodiment.
Figure 5:
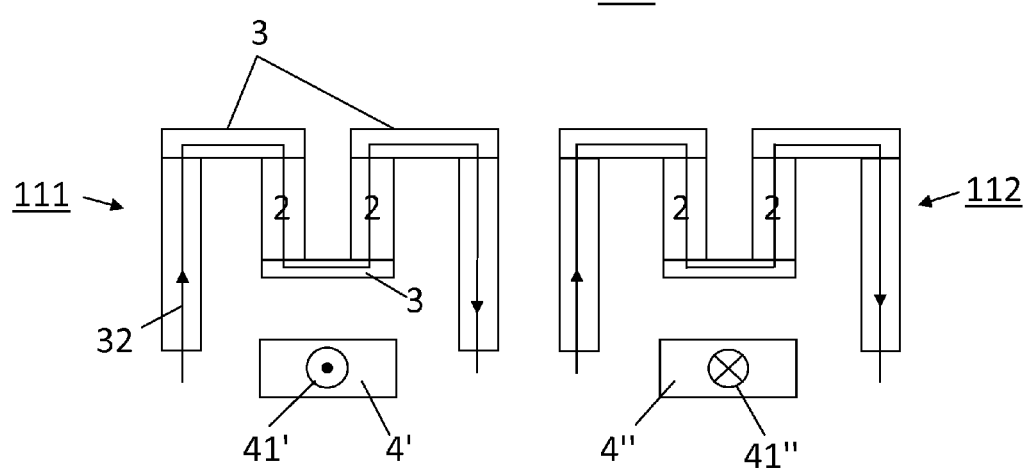
FIG. 5 illustrates a side view of the magnetic device of FIG. 4, according to an embodiment.

FIGS. 4 and 5 illustrate a top view (FIG. 4) and a side view (FIG. 5) of a magnetic device 100, according to an embodiment. The magnetic device 100 comprises a plurality of MLU cells 1 arranged in an array of row and columns, each row having MLU cells 1 connected in series via the bit line 3 and a conductive strap. A programming line 4 is configured for passing a programming current pulse 41 for programming any one of said plurality of MLU cells 1. During a programming operation, the programming current pulse 41 passing in the programming line 4 is adapted for heating the magnetic tunnel junction 2 at a high threshold temperature $T_H$ such as to unpin a second magnetization 231 of each of the plurality of MLU cells 1. The programming current pulse 41 is further adapted for generating a programming magnetic field 42 adapted for switching the storage magnetization 231 of each of the plurality of MLU cells 1 in a programmed direction. As will be described below, the programming line 4 is physically separated from each of said plurality of MLU cells 1 by an electrically non-conductive layer 71 and no current can passed directly from the programming line 4 is to the magnetic tunnel junction 2.

Figure 1:
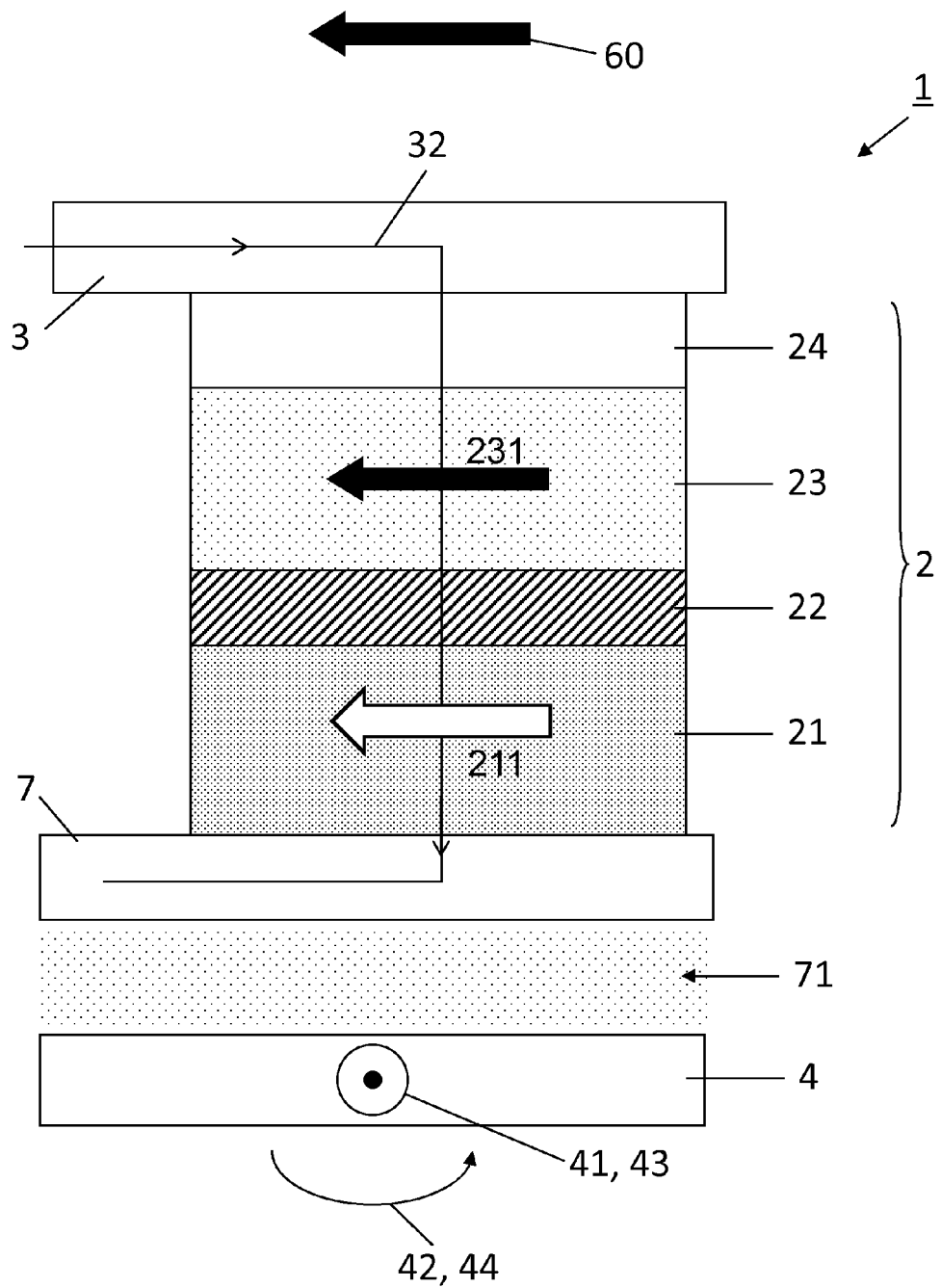
FIG. 1 illustrates a detailed view of a MLU cell 1, according to an embodiment.

FIG. 1 illustrates a detail of one of the MLU cells 1, according to an embodiment. Here, the expression MLU cell also means a magnetic random access memory (MRAM) cell. The MLU cell 1 includes a first magnetic layer 23, a second magnetic layer 21, and a tunnel barrier layer 22 that is disposed between the first magnetic layer 23 and the second magnetic layer 21. The first magnetic layer can be a storage layer 23 having the storage magnetization 231 and the second magnetic layer can be a sense layer 21 having a sense magnetization 211. Each of the sense layer 21 and the storage layer 23 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 21 and the storage layer 23 can include the same ferromagnetic material or different ferromagnetic materials. As illustrated in FIG. 1, the sense layer 21 can include a soft ferromagnetic material, namely one having a relatively low coercivity, while the storage layer 23 can include a hard ferromagnetic material, namely one having a relatively high coercivity. In such manner, a magnetization of the sense layer 21 can be readily varied under low-intensity magnetic fields. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B). A thickness of each of the sense layer 21 and the storage layer 23 can be in the nm range, such as from about 1 nm to about 20 nm or from about 1 nm to about 10 nm. Other implementations of the sense layer 21 and the storage layer 23 are contemplated. For example, either, or both, of the sense layer 21 and the storage layer 23 can include multiple sub-layers in a fashion similar to that of the so-called synthetic antiferromagnetic layer.

The tunnel barrier layer 22 can include, or be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 10 nm.

Other implementations of the MLU cell 1 are contemplated. For example, the relative positioning of the sense layer 22 and the storage layer 23 can be reversed, with the sense layer 21 disposed above the storage layer 23.

Referring to FIG. 1, the magnetic tunnel junction 2 also includes a storage antiferromagnetic layer 24, which is disposed adjacent to the storage layer 23 and, through exchange bias, pins the storage magnetization 231 along a particular direction when a temperature within, or in the vicinity of, the storage antiferromagnetic layer 24 is at a low threshold temperature $T_L$, i.e., below a blocking temperature, such as a Neel temperature, or another threshold temperature of the storage antiferromagnetic layer 24. The storage antiferromagnetic layer 24 unpins, or frees, the storage magnetization 231 when the temperature is at the high threshold temperature $T_H$, i.e., above the blocking temperature, thereby allowing the storage magnetization 231 to be switched to another direction.

The storage antiferromagnetic layer 24 includes, or is formed of, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). For example, the storage antiferromagnetic layer 24 can include, or be formed of, an alloy based on Ir and Mn (or based on Fe and Mn) having a high threshold temperature $T_H$ in the range of about 120° C. to about 220° C., or about 150° C. to about 200° C. Because the sense magnetization 211 is unpinned, the high threshold temperatures $T_H$ can be selected to accommodate a desired application, such as a high temperature application, in the absence of, or without regard to, a threshold temperature that would otherwise set an upper bound of an operating temperature window. The sense magnetization 211 is freely adjustable at the low and high threshold temperatures $T_L$, $T_H$. This type of MLU cell 1 comprising the sense layer 21 with the freely adjustable sense magnetization 211 is known as self-referenced MLU cell.

The MLU cell 1 further includes the programming line 4 adapted for passing a programming current pulse 41. The programming line 4 and the magnetic tunnel junction 2 are physically separated from one another by an electrically non-conductive layer, represented by a dielectric or oxide layer 71 in FIG. 1. The programming line 4 can thus be magnetically coupled to the magnetic tunnel junction 2 but is not in electrical contact with the magnetic tunnel junction 2.

During the programming operation of the magnetic device 100, the programming current pulse 41 is passed in the programming line 4 for switching the storage magnetization 231 of each of the plurality of MLU cells 1.

Figure 2A:
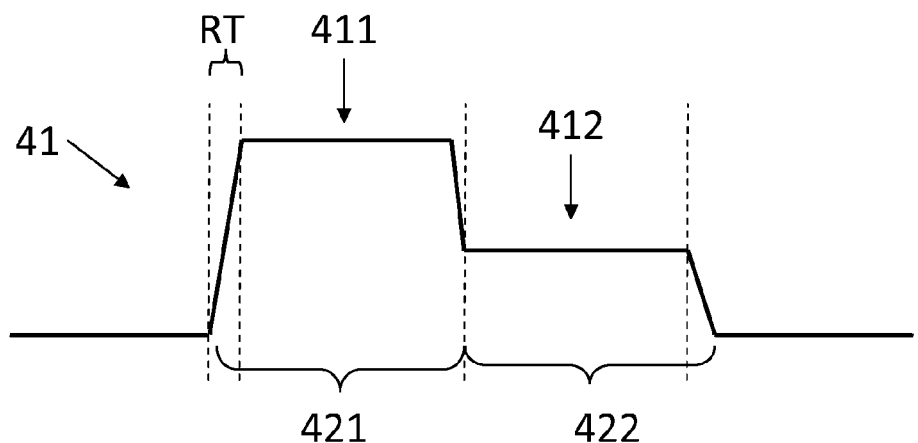
FIGS. 2a to 2c show a chronogram of a programming operation, according to an embodiment.

FIG. 2a shows a chronogram of the programming current pulse 41, according to an embodiment, wherein passing the programming current pulse 41 comprises passing a first pulse portion 411 of the programming current pulse 41 during a first time period 421. The first pulse portion 411 having a first intensity such that the magnetic tunnel junction 2 can be heated at the high threshold temperature $T_H$. The first intensity of the first pulse portion 411 is further adapted for inducing a programming magnetic field 42 capable of switching the storage magnetization 231, once the magnetic tunnel junction 2 is at the high threshold temperature $T_H$. The heat generated by Joule effect through the programming line 4 by passing the first pulse portion 411 is transmitted to the magnetic tunnel junction 2 by thermal conduction through the dielectric/oxide layer 71.

Passing the programming current pulse 41 further comprises passing a second pulse portion 412 of the programming current pulse 41 during a second time period 422. The programming current pulse 41 has a second intensity that is lower than the first intensity of the first pulse portion 411 such that the magnetic tunnel junction 2 is no more heated at the high threshold temperature $T_H$ and is cooled down to the low threshold temperature $T_L$. The second intensity of the second pulse portion 412 is however adapted for inducing the programming magnetic field 42 capable of switching the storage magnetization 231 before the magnetic tunnel junction 2 reaches the low threshold temperature $T_L$. After reaching the low threshold temperature $T_L$, the storage magnetization becomes pinned in the switched, or programmed, orientation.

Referring to FIG. 2a, the first current pulse portion 411 has a rise time RT that is short enough such as to rapidly heat the magnetic tunnel junction 2 to the high threshold temperature $T_H$. For example, the rise time RT can be below about 5 µs, but preferably below about 100 ns. The first time period 421 of the first pulse portion 411 is typically about a few microseconds to a few seconds (for example between about 1 µs and about 10 s). The rise time RT can also be longer than 5 µs, depending on the configuration of the MLU cell 1 and the programming line 4.

Figure 2B:
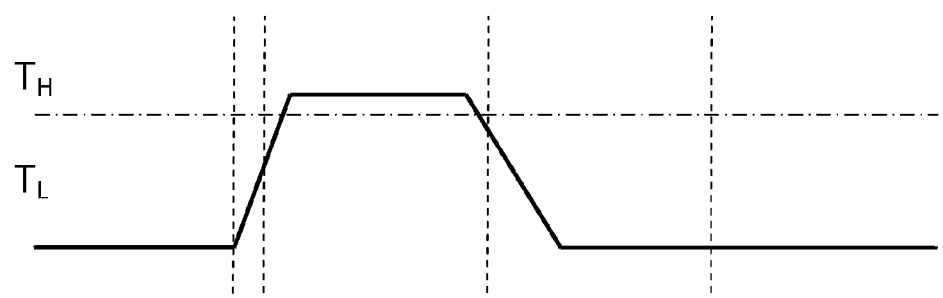
Figure 2C:
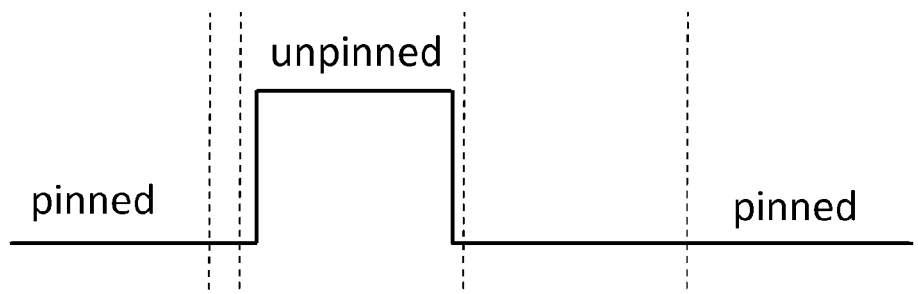

FIG. 2b shows the variation with time of the temperature in the magnetic tunnel junction 2 when the first and second pulse portion 411, 412 of the programming current pulse 41 are passed in the programming line 4 during the programming operation. In FIG. 2b, the horizontal dashed line indicates a threshold temperature above which the magnetic tunnel junction 2 is at the high threshold temperature $T_H$ and the storage magnetization 231 is unpinned (see FIG. 2c), and below which the magnetic tunnel junction 2 is at the low threshold temperature $T_L$ and the storage magnetization 231 is pinned.

Figure 3A:
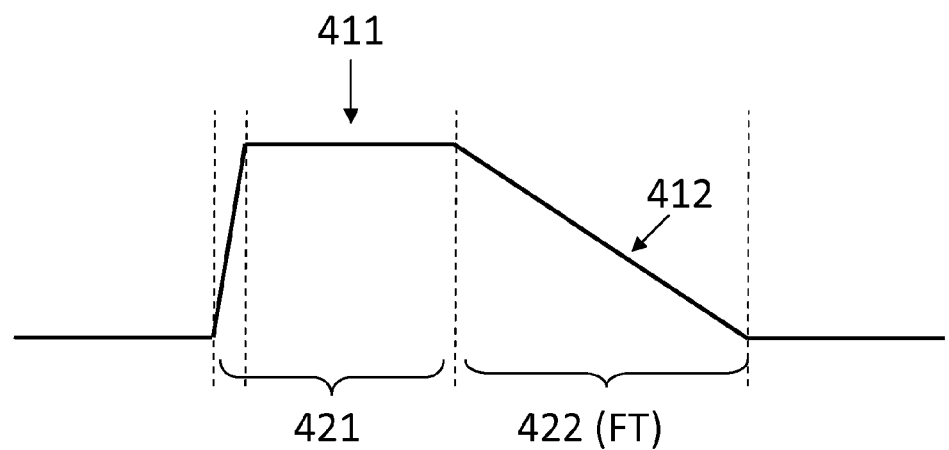
FIGS. 3a to 3c show a chronogram of a programming operation, according to another embodiment.
Figure 3B:
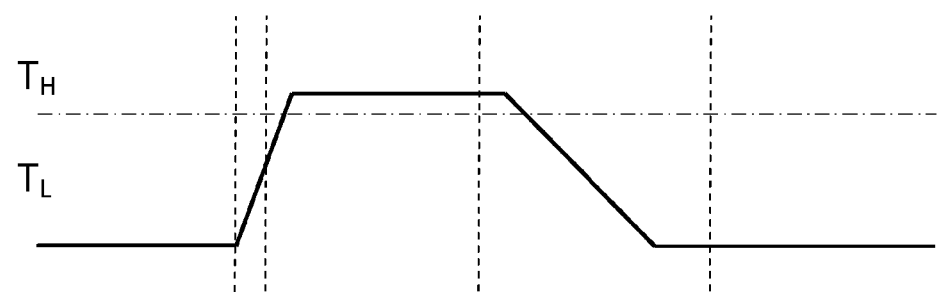
Figure 3C:
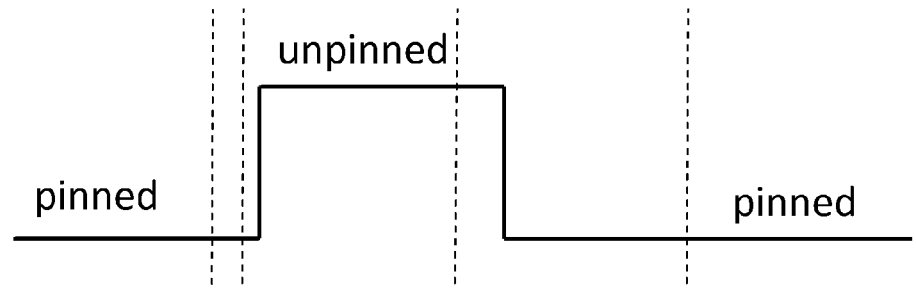

In another embodiment illustrated in FIGS. 3a to 3c, the second pulse portion 412 of the programming current pulse 41 has a second intensity that decreases in a monotonic manner from the first intensity, during the second time period 422, or fall time period FT (see FIG. 3a). During the first time period, the magnetic tunnel junction 2 is heated at the high threshold temperature $T_H$ and the storage magnetization 231 switched in the programmed orientation by passing the first pulse portion 411 during the first time period 421. During the second time period 422, the decreasing second intensity of the second pulse portion 412 results in the tunnel magnetic junction 2 cooling down at the low threshold temperature $T_L$. FIG. 3b illustrates the variation with time of the temperature in the magnetic tunnel junction 2 when the first and second pulse portion 411, 412 of the programming current pulse 41 are passed in the programming line 4 during the programming operation. The decreasing second intensity of the second pulse portion 412 cools the magnetic tunnel junction 2 at the low threshold temperature $T_L$ (horizontal dashed line). The time at which the magnetic tunnel junction 2 reaches the low threshold temperature $T_L$ depends on the decreasing rate of the second intensity of the second pulse portion 412. The decreasing second intensity of the second pulse portion 412 is further arranged such that the write magnetic field 42 induced by the second pulse portion 412 is capable of switching the storage magnetization 231 when the magnetic tunnel junction 2 is at the high threshold temperature $T_H$. The decreasing rate of the second intensity of the second pulse portion 412 depends on the current source and on the thermalization time of the magnetic tunnel junction 2. In a particular example, the first pulse portion 411 can decrease at a rate of up to about $2 \times 10^6$ mA/s (or up to about $1.7 \times 10^4$ A/µm²/s).

In a variant, the second intensity of the second pulse portion 412 is decreased stepwise. Each step of the second pulse portion 412 can have a duration between about few nanoseconds up to few hours (for example between about 1 ns and 1 h). Preferably, each step of the second pulse portion 412 has a duration between 1 µs and 1 ms, until the second intensity of the second pulse portion 412 reaches zero. The duration of the second pulse portion 412 and the second time period 422 depend on the specific configuration of the MRAM cell 1 and programming line 4 and of the high threshold temperature $T_H$. Faster decreasing rate of the second intensity is possible since a thermalization time of the magnetic tunnel junction 2 is typically less than one millisecond.

The first intensity of the first pulse portion 411 allowing the heating of the magnetic tunnel junction 2 at the high threshold temperature $T_H$ depends on the design of the magnetic device 100 and of the programming line 4 and of the thickness of the dielectric or oxide layer 71. In an example, the dielectric or oxide layer 71 can have a thickness of about 55 nm, and the programming line 4 a thickness of about 0.4 µm and a width of about 0.32 µm. A temperature above 125° C. can be reached in the storage antiferromagnetic layer 24 including an alloy based on FeMn when the intensity of the first portion 411 is between about 25 mA and 30 mA. Such intensity of the first pulse portion 411 can induce a write magnetic field 42 of about 200 Oe in the plane of the programming line 4. In particular, for a first pulse portion 411 having an intensity of about 30 mA, a temperature of more than 200° C. has been measured for the programming line 4. Here, the temperature can be measured from a resistance of the programming line 4 and of the temperature coefficient of the resistance (TCR) of copper (for a copper programming line 4).

Typically, an intensity of the first pulse portion 411 is smaller than about 50 mA (about $1 \times 10^{-3}$ A/μm$^2$) such as to avoid electromigration issues in the magnetic tunnel junction 2. However, a very fast dynamic current pulse having a first pulse portion 411 greater than about 100 mA and a first time period 421 of a few tens of microseconds can be injected without damaging the line by electromigration. For example, the first pulse portion 411 can be up to about 115 mA (about 1 A/μm$^2$), or up to 10 A/μm$^2$, and the first time period 421 can be as short as about 180 μs.

In an embodiment, the programming line 4 can be made in copper and can be patterned in a silicon substrate by using a Damascene-type process. The programming line 4 can be in other metals than copper that can support high temperatures and that are not too sensitive to electromigration. Such metals include aluminum or an Al/Cu alloy, preferably with a high Cu content.

In an embodiment, the dimension (cross section) of the programming line 4 is of the same order of magnitude than the dimensions of each of the MLU cells 1 such that the intensity distribution of the heating and the programming magnetic field 42 generated by the programming line 4 is substantially homogeneous along the plane of the magnetic tunnel junction 2, as confirmed by thermal and magnetic simulations. In such configuration, any one of the magnetic layers 21, 23, 24 of the magnetic tunnel junction 2, and in particular the antiferromagnetic layer 24, is exposed to a homogeneous heating and a programming magnetic field 42 along their plane, such that partial programming of the plurality of MLU cells 1 can be avoided.

The dimension (cross section) of the programming line 4 should not be too small, since the electrical resistance of the programming line 4 would be very high and the voltage required for passing the programming current pulse 41 would also be very high and could possibly degrade the programming line 4, for example, due to electromigration, and the gain in heating and in the programming magnetic field 42 can yet be small. On the other hand, the dimension (cross section) of the programming line 4 should also not be too large such that when the programming current 41 is passed, the electrons in the line 4 are arranged homogeneously in the line volume. For example, the electrons being farther from the magnetic tunnel junction 2 will contribute less to the generated programming magnetic field 42. This was verified experimentally and using numerical modelling with great accuracy.

In a preferred embodiment, a thickness of the programming line 4 is of between 100 nm and 500 nm, preferably of between 200 nm and 400 nm, or more preferably of between 300 nm and 400 nm. In a specific embodiment, a thickness of the programming line 4 is of about 380 nm.

In an embodiment, the programming line 4 has a width of between 100 nm and 1 μm or preferably of between 200 nm and 500 nm or more preferably of between 300 nm and 400 nm. The magnetic tunnel junction 2 has a diameter of between 100 nm and 500 nm or preferably of between 200 nm and 400 nm, or more preferably of between 200 nm and 300 nm. In a specific embodiment, the programming line 4 has a width of about 320 nm and the magnetic tunnel junction 2 has a diameter of about 230 nm.

Simulations further showed that the above dimensions of width and thickness of the programming line 4 is a good trade-off between heating and programming magnetic field 42 efficacy, magnitude of the programming current pulse 41 and robustness of the programming line 4.

A distance between the programming line 4 and the magnetic tunnel junction 2 should be small enough for obtaining an effective heating of the magnetic tunnel junction 2 through the dielectric/oxide layer 71 and such that the programming magnetic field 42 generated by the programming line 4 is capable of switching the storage magnetization 231. A distance between the programming line 4 and the magnetic tunnel junction 2 should be between 10 nm and 500 nm. The distance between the programming line 4 and the magnetic tunnel junction 2 is between 50 nm and 300 nm and preferably between 60 nm and 200 nm. In a specific embodiment, the distance between the programming line 4 and the antiferromagnetic layer 24 in the magnetic tunnel junction 2 is about 100 nm. In another specific embodiment, the programming line 4 is below the magnetic tunnel junction 2 and the distance between the programming line 4 and the antiferromagnetic layer 24 is about 100 nm.

Referring again to FIG. 2a, the first current pulse portion 411 can have a magnitude between 10 mA and 50 mA (for the programming line 4 with 0.32 μm wide and 0.38 μm in thickness, current densities are $8.2 \times 10^6$ A/cm$^2$ and $4.1 \times 10^7$ A/cm$^2$ respectively), and a first time period 421 between 10 ns and 10 s for the programming line 4 having a width of about 320 nm and a height of about 380 nm. In an embodiment, the first current pulse portion 411 has a magnitude of about 50 mA and the first time period 421 is about 200 μs.

Because the storage magnetization direction 231 can be aligned according to the programming magnetic field 42, the storage magnetization direction 231 can be switched between multiple directions according to a programming encoding scheme. One possible encoding scheme is implemented with a pair of directions that are displaced by about 180°, such that a "0" is assigned to one of the pair of directions, and a "1" is assigned to another one of the pair of directions.

In a self-referenced sensing operation of the MLU cell 1, a first input current 43 (or input signal) may be applied to the MLU cell 1 such as to modulate a resistance of the MLU cell 1. For example, the first input current 43 may be a field current 43 that flows through the programming line 4, where the field current 43 generates an input magnetic field 44 that modulate the resistance of the MLU cell 1 in accordance with the polarity of the field current 43. For example, the sense field current 43 can have an alternating polarity. The field current 43 generates an input magnetic field 44 that alternates the sense magnetization 211 between a direction substantially parallel and antiparallel to the storage magnetization 231. The alternating field current 43 can be such that the orientation of the sense magnetization 211 is alternated without being switched completely in the parallel or antiparallel direction. The in-plane component of the external magnetic field is then sensed by measuring a resistance R (or voltage) of the magnetic tunnel junction 2 as a function of the field current 43. Such sensing operation is described in more details in patent application US2013241536 by the present applicant.

The MLU cell 1 can also be used for sensing an external magnetic field 60, such as the earth magnetic field (see FIG. 1). Here, the sense magnetization 211 is aligned in the external magnetic field 60, in accordance with the respective orientation of the external magnetic field 60 and of the orientation of the MLU cell 1 with respect to the external magnetic field 60. The sensing an external magnetic field using a self-referenced MLU cell has been described in US patent application US2013241536 and European patent application No. 13290243 by the present applicant.

The input current 43 should be low enough to avoid heating the magnetic tunnel junction 2 close to the high threshold temperature $T_H$ of the storage antiferromagnetic layer 24. For example, the input current 43 can be set to be lower than about 20 μA to prevent the storage magnetization 231 from switching during the sensing operation. In comparison, the first pulse portion 411 is typically three orders of magnitude larger.

Returning to the example illustrated in FIGS. 4 and 5, the programming line 4 comprises a first branch 4' arranged for programming a first subset 111 comprising one or more rows of said plurality of MLU cells 1. The programming line 4 further comprises a second branch 4" arranged for programming a second subset 112. In the example illustrated in FIG. 5, each of the first subset 111 and the second subset 112 comprises two adjacent rows of MLU cells 1. Each row of the first subset 111 is addressed by a first branch 4' and each row of the second subset 112 is addressed by a second branch 4". The first branches 4' are electrically connected in series to the second branches 4" such that, during the programming operation of the magnetic device 100, passing the programming current pulse 41 in the programming line 4 comprises passing a first current portion 41' in the first branches 4' and passing a second current portion 41" in the second branches 4". Due to the configuration of the first branches 4' electrically connected at one end the second branches 4" such as to form a "U" shape or a serpentine, the first current portion 41' flows in the first branches 4' in a direction opposed to the one of the second current portion 41" flowing in the second branches 4". The storage magnetization 231 of the MLU cells 1 in the first subset 111 are thus programmed in a first programmed direction, while the storage magnetization 231 of the MLU cells 1 in the second subset 112 are programmed in a second programmed direction, opposed to the first programmed direction.

In the example of FIGS. 4 and 5, the programming line 4 address a subset 111 of the plurality of MLU cells 1 comprised in the magnetic device 100. In other words, the state of each MLU cell 1 in the subset 111 can be programmed (written) by passing the programming current 41 in the field line 4. A subset 111, 112 can comprise any number of MLU cells 1 that is two or greater, the MLU cells 1 can be arranged in any possible configurations provided that a single programming line 4 can address the subset such that all the MLU cells 1 comprised in the addressed subset are programmed by the single programming current 41 passing in the programming line 4.

The programming method disclosed herein allows for writing, or programming, simultaneously the MLU cells 1 comprised in the subset 111 using a single programming line 4 and a single programming current (41). The subset 11 comprises more than one MLU cell 1, typically several cells along a row or column of an array. Each of the MLU cells 1 comprised in the subset 111 can thus be programmed by using a single programming current 41 and a single programming line 4. In contrast with conventional memory device and programming methods, the method of the invention does not require the use of any additional current or line for programming the subset 111 of MLU cells 1. There is also no need for synchronizing between two or more programming currents A configuration where a single first branch 41' for programming the first subset 111 is used instead of the two first branches 41', and where a single second branch 41" is used instead of the two second branches 41" for programming the second subset 111 can also be contemplated. In this latter configuration, a width of the single first and second branch 4', 4" should preferably extend under (or over) the adjacent MLU cells 1 in a column (see FIG. 6).

The programming line 4 comprising the branches 4' and 4" can be seen as a single programming line 4 having a "U" or curved shape, or a serpentine shape. The first subset 111 thus corresponds to the MLU cells 1 being programmed in a first programmed direction by a portion of the programming line 4, and the second subset 112 corresponds to the MLU cells 1 being programmed in a second programmed direction, opposed to the first programmed direction, by another portion of the programming line 4.

Figure 6:
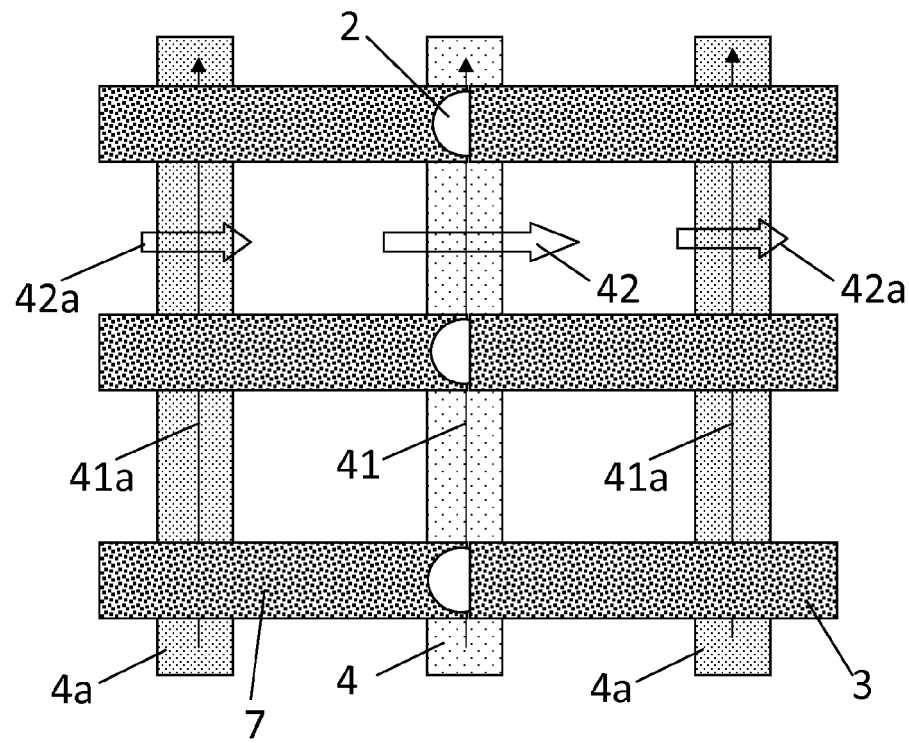
FIG. 6 shows a top view and FIG. 7 shows a side view of a portion of the magnetic device, according to another embodiment.
Figure 7:
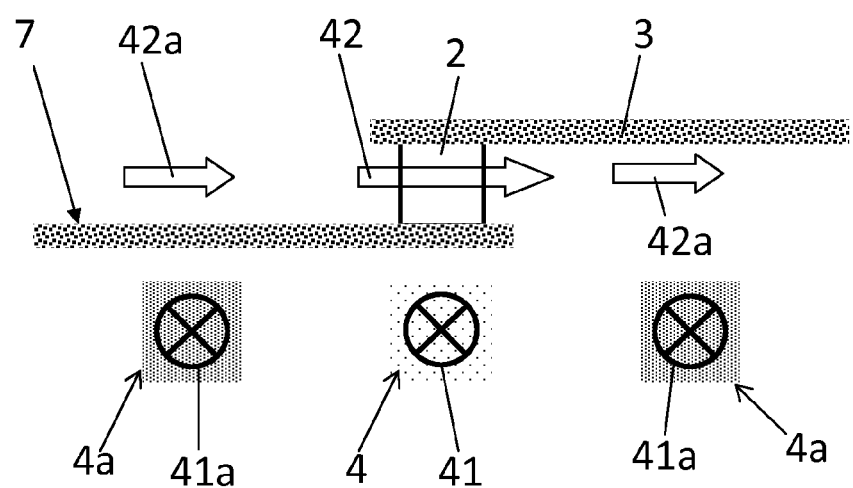

FIG. 6 is a top view and FIG. 7 is a side view of a portion of the magnetic device 100 according to another embodiment. In particular, a column (or row) of MLU cells 1 is addressed by a programming line 4 and two extra field lines 4a, each extra field line 4a being configured for passing an extra field current pulse 41a. As described for the magnetic device 100 of FIGS. 4 and 5, the MLU cells 1 are electrically connected in series along the rows via the current line 3 and the strap 7. During the programming operation, the programming current pulse 41 is passed in the programming line 4 such as to heat the MLU cells 1 in the row at the high threshold temperature $T_H$ and to induce the programming magnetic field 42 for switching the storage magnetization 231 in the MLU cells 1 in the programmed direction. The extra field current pulse 41a is adapted for inducing an extra magnetic field 42a capable of switching the storage magnetization 231 in the MLU cells 1 in the programming direction when the latter are at the high threshold temperature $T_H$. However, due to the distance between the extra field lines 4a and the MLU cells 1, the current pulse 41a cannot significantly contribute in heating the MLU cells 1. The extra magnetic field 42a can however contribute in switching the storage magnetization 231. The extra field lines 41a could have the same size than the programming line 4 with the advantage that integration with the other lines 4 and junction 2 will be easier during fabrication. However, the extra field lines 41a need not have the same size than the programming line 4. Indeed, the role of these extra-lines 41a is to supply extra-magnetic field and their sizes could be selected such as to provide the most efficient extra-magnetic field 42a.

The contribution of the extra magnetic field 42a for switching the storage magnetization 231 can be particularly useful when passing the second pulse portion 412 of the programming current pulse 41 during the second time period 422. Indeed, the second intensity of the second pulse portion 412 may not be enough to induce the programming magnetic field 42 capable of maintaining the storage magnetization 231 in the programmed orientation, such that the storage magnetization 231 can be deviated from the programming orientation before the MLU cell 1 has cooled down to the low threshold temperature $T_L$.

Figure 8:
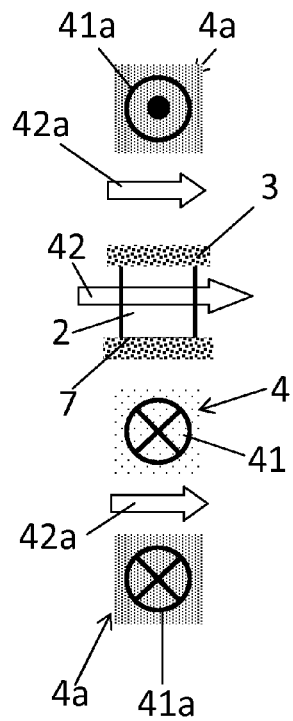
FIG. 8 shows side view of a portion of the magnetic device according to yet another embodiment.

The configuration of the extra field lines 4a is not limited to the one shown in FIGS. 6 and 7. As illustrated in FIG. 8, the extra field lines 4a can be arranged to be parallel to the current line 3 and strap 7. Although in FIGS. 6 and 7 the extra field lines 4a are represented to be configured below the MLU cell 1 and on each side of the programming line 4, the extra field lines 4a can also be arranged above the MLU cell 1, or below the programming line 4 (see FIG. 8). FIG. 8 also shows that the extra field lines 4a can also be arranged below and above the MLU cell 1. The magnetic device 100 can comprise one or more of the extra field lines 4a.

The magnetic device 100 configured such as in the example of FIGS. 4 and 5 can be used as a sensor device for measuring an external magnetic field. Indeed, after completing the programming operation, the storage magnetization 231 of the MLU cells 1 in the first subset 111 are oriented in a direction opposed to the one of the storage magnetization 231 of the MLU cells 1 in the second subset 112. The first subset 111 thus presents a response to the external magnetic field that is opposed the response from the second subset 112.

During a sensing operation, the magnetic device 100 is used as a dividing bridge. In other words, a voltage can be applied on the two subsets 111, 112, i.e., between points A and B (see FIG. 4) on a current line 3 electrically connecting the MLU cells 1 in series along a column, and an intermediate voltage is measured at point A. Alternatively, a sense current 32 can be passed in the current line 3 (between points A and B) and a resistance, or impedance, measured between points A and B. When the magnetic device 100 is submitted to an external magnetic field, the resistance of one of the subsets 111, 112 increases while the resistance of the other subset 112, 111 decreases. An intermediate resistance at point A is thus easily measurable and is proportional to the external magnetic field. In the arrangement of FIGS. 4 and 5, the MLU cells 1 in the first subset 111 and in the second subset 112 are electrically connected by the current line 3 independently such as to independently measure a resistance for the first subset 111 and the second subset 112.

Figure 9:
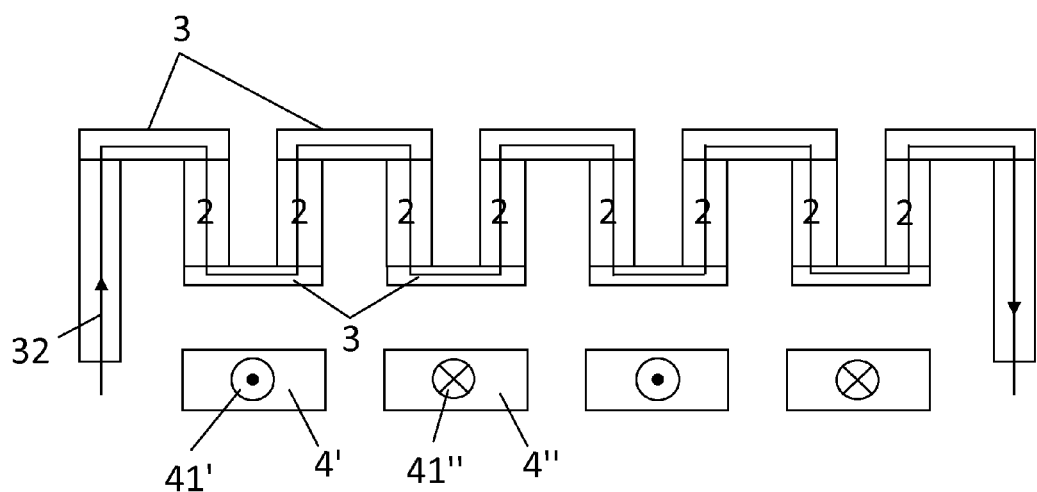
FIG. 9 illustrates a side view and FIG. 10 illustrates a top view of a magnetic device comprising a plurality of the MLU cells, according to yet another embodiment.
Figure 10:
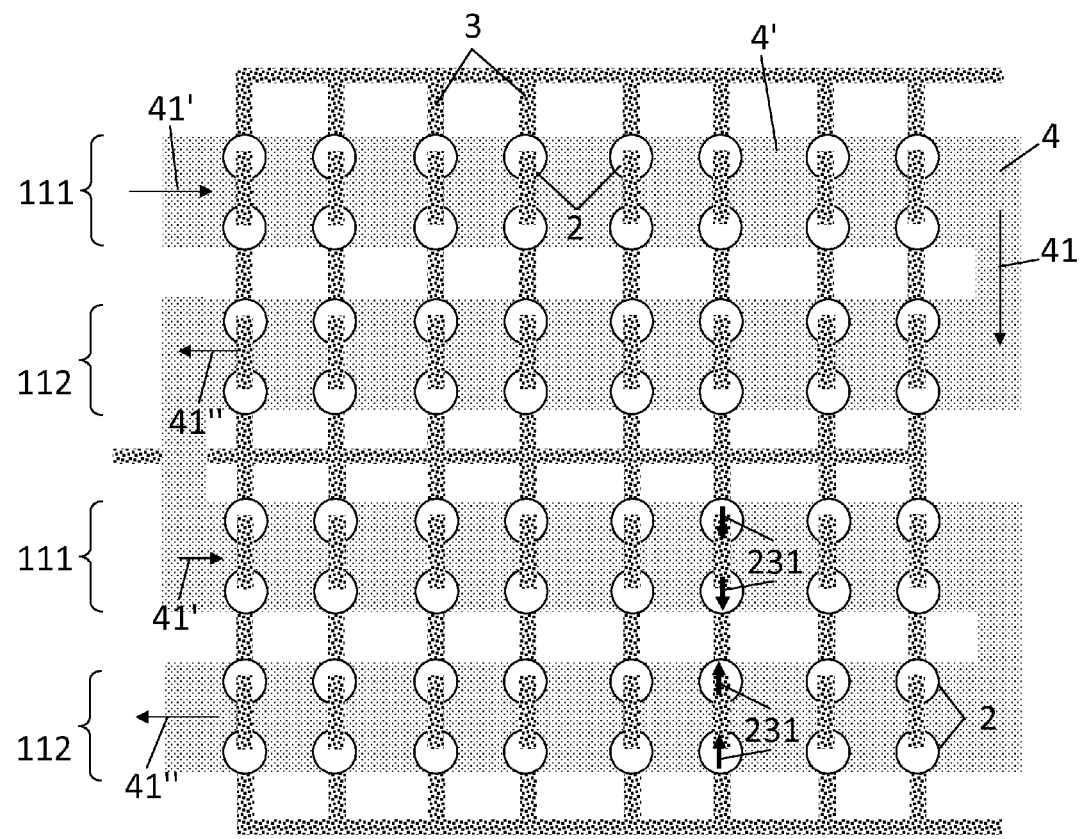

FIGS. 9 and 10 illustrate the magnetic device 100 according to another embodiment where the current line 3 electrically connects all MLU cells 1 in series along a column, such that the MLU cells 1 in the first subset 111 are electrically connected along a column with the MLU cells 1 in the second subset 112. Such configuration of the magnetic device 100 can be used as a low-noise amplifier (see patent application US2013241536).

REFERENCE NUMBERS AND SYMBOLS

1 MLU cell
100 magnetic device
111 first subset
112 second subset
2 magnetic tunnel junction
21 reference layer
211 sense magnetization
22 tunnel barrier layer
23 storage layer
231 storage magnetization
24 storage antiferromagnetic layer
3 bit line
32 sense current
4 programming line
4' first branch
4" second branch
4a extra field line
41 programming current pulse
41' first current portion
41" second current portion
41a extra field current pulse
411 first pulse portion
412 second pulse portion
42 programming magnetic field
42a extra magnetic field
421 first time period
422 second time period
43 input current, field current
44 input magnetic field
60 external magnetic field
7 strap
71 dielectric/oxide layer
FT fall time, decrease period
R junction resistance
RT rise time
$T_H$ high threshold temperature
$T_L$ low threshold temperature

What is claimed is:

1. A method for programming a magnetic device comprising a plurality of magnetic logical unit MLU cells using a single programming current; each including a magnetic tunnel junction comprising a ferromagnetic storage layer having a storage magnetization that is pinned at a low threshold temperature and freely orientable at a high threshold temperature, a ferromagnetic sense layer having a sense magnetization, and a tunnel barrier layer between the storage layer and the sense layer; a programming line physically separated from each of said plurality of MLU cells by an electrically non-conductive layer such that no current can pass directly from the programming line to the magnetic tunnel junction, and configured for passing a programming current pulse for programming a subset of said plurality of MLU cells, the subset comprising more than one MLU cell; the method comprising:
    passing the programming current in the programming line for heating the magnetic tunnel junction of said MLU cells in the subset at the high threshold temperature such as to unpin the ferromagnetic storage magnetization of each of the MLU cells in the subset;
    wherein the programming current is further adapted for generating a programming magnetic field adapted for switching the storage magnetization of each MLU cell in the subset in a programmed direction.

2. The method according to claim 1, wherein said passing the programming current comprises:
    passing a first pulse portion during a first time period, the first current having a first intensity adapted for inducing the write magnetic field capable of switching the storage magnetization, and heating the magnetic tunnel junction at the high threshold temperature; and
    passing a second pulse portion during a second time period having a second intensity lower than the first intensity such as to induce the write magnetic field capable of switching the storage magnetization, and cool the magnetic tunnel junction at the low threshold temperature.

3. The method according to claim 2, wherein the second intensity of the second pulse portion decreases in a monotonic manner during the second time period.

4. The method according to claim 3, wherein the second intensity of the second pulse portion decreases at a decreasing rate such that the programming magnetic field induced by the second pulse portion is capable of switching the storage magnetization until the magnetic tunnel junction has reached the low threshold temperature.

5. The method according to claim 3, wherein the second intensity of the second pulse portion is decreased stepwise.

6. The method according to claim 5, wherein each step of the second pulse portion has a duration between about 1 ns and 1 h, and preferably between about 1 µs and 1 ms.

7. The method according to claim 2, wherein the first pulse portion has a rise time of less than about5 µs and preferably less than about 100 ns.

8. The method according to claim 2, wherein the first time period is of about few microseconds to few seconds.

9. The method according to claim 4, wherein a decreasing rate of the second intensity is of about $1.7 \times 10^4$ A/µm²/s.

10. The method according to claim 2, wherein said first pulse portion has a magnitude between about $1 \times 10^{-3}$ A/µm² and about 10 A/µm².

11. The method according to claim 1,
wherein the magnetic device further comprises at least one extra field line configured for passing an extra field current pulse; and
wherein the method further comprises passing the extra field current pulse in said at least one extra field line such as to induce an extra magnetic field adapted for switching the storage magnetization in the programming direction in any one of said plurality of MLU cells; when the MLU cells are at the high threshold temperature.

12. The method according to claim 11, wherein said at least one extra field line comprises at least two extra field lines, and wherein the extra field current pulse is passed in each of said at least two extra field lines.

13. The method according to claim 12, wherein the extra field lines are arranged below the MLU cells, and wherein the extra field current pulse is passed in each of the extra field lines with the same polarity.

14. The method according to claim 12, wherein the extra field lines are arranged below and above the MLU cells, and wherein the extra field current pulse passed in the extra field lines arranged below the MLU cells has a polarity opposed to the one of the extra field current pulse passed in the extra field lines arranged above the MLU cells.

15. The method according to claim 1,
wherein the programming line comprises a first branch arranged for programming a first subset comprising one or more rows of said plurality of MLU cells, and a second branch arranged for programming a second subset comprising one or more rows of said plurality of MLU cells adjacent to said one or more rows of said plurality of MLU cells of the first subset; and
wherein the method comprises:
passing a first current portion of the programming current pulse in the first branch such as to program the storage magnetization of the MLU cells in the first subset in a first programmed direction, and passing a second current portion of the programming current pulse in the second branch such as to program the storage magnetization of the MLU cells in the second subset in a second programmed direction opposed to the first programmed direction.

\* \* \* \* \*